(12) United States Patent
Velez et al.

(10) Patent No.: US 10,332,671 B2
(45) Date of Patent: Jun. 25, 2019

(54) SOLENOID INDUCTOR

(71) Applicant: QUALCOMM Incorporated, San Diego, CA (US)

(72) Inventors: Mario Francisco Velez, San Diego, CA (US); Niranjan Sunil Mudakatte, San Diego, CA (US); Changhan Hobie Yun, San Diego, CA (US); Daeik Daniel Kim, Del Mar, CA (US); David Francis Berdy, San Diego, CA (US); Jonghae Kim, San Diego, CA (US); Yunfei Ma, Cambridge, MA (US); Chengjie Zuo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/345,312

(22) Filed: Nov. 7, 2016

(65) Prior Publication Data
US 2017/0133148 A1    May 11, 2017

Related U.S. Application Data

(60) Provisional application No. 62/252,567, filed on Nov. 8, 2015.

(51) Int. Cl.
*H04B 5/00* (2006.01)
*H01F 27/02* (2006.01)
(Continued)

(52) U.S. Cl.
CPC ....... *H01F 27/2823* (2013.01); *H01F 27/022* (2013.01); *H01F 27/2828* (2013.01);
(Continued)

(58) Field of Classification Search
CPC ........ H01F 38/14; H01F 41/06; H01F 41/061; H01F 41/063; H01F 41/064;
(Continued)

(56) References Cited

U.S. PATENT DOCUMENTS 7,710,335 B2    5/2010  Yegin et al.
8,558,752 B2   10/2013  Amadeo et al.
(Continued)

FOREIGN PATENT DOCUMENTS

JP    H10289921 A    10/1998
WO       0010179 A1    2/2000
WO    2008011459 A2    1/2008

OTHER PUBLICATIONS

International Search Report and Written Opinion—PCT/US2016/060932—ISA/EPO—dated Apr. 6, 2017.
(Continued)

*Primary Examiner* — Marc Anthony Armand
(74) *Attorney, Agent, or Firm* — Muncy, Geissler, Olds & Lowe, P.C.

(57) ABSTRACT

An inductor with multiple loops and semiconductor devices with such an inductor integrated thereon are proposed. In an aspect, the semiconductor device may include a die on a substrate, an inductor on the die in which the inductor comprises a wire with multiple non-planar loops above the die. In another aspect, the semiconductor device may include a plurality of posts on a die on a substrate, and an inductor on the die. The inductor may include a wire looped around the plurality of posts such that the inductor includes multiple non-planar loops.

26 Claims, 13 Drawing Sheets

(51) Int. Cl.
*H01F 27/28* (2006.01)
*H01L 23/31* (2006.01)
*H01L 23/00* (2006.01)
*H01L 21/56* (2006.01)
*H01F 27/29* (2006.01)
*H01F 41/06* (2016.01)
*H01F 38/14* (2006.01)
*H01L 23/522* (2006.01)
*H01L 23/64* (2006.01)
*H01L 25/16* (2006.01)
*H01L 49/02* (2006.01)

(52) U.S. Cl.
CPC ............ *H01F 27/29* (2013.01); *H01F 38/14* (2013.01); *H01F 41/06* (2013.01); *H01L 21/565* (2013.01); *H01L 23/3107* (2013.01); *H01L 23/3157* (2013.01); *H01L 23/5227* (2013.01); *H01L 23/645* (2013.01); *H01L 24/06* (2013.01); *H01L 24/48* (2013.01); *H01L 24/49* (2013.01); *H01L 25/16* (2013.01); *H01L 28/00* (2013.01); *H01L 28/10* (2013.01); *H04B 5/0081* (2013.01); *H01L 24/16* (2013.01); *H01L 24/73* (2013.01); *H01L 2223/6677* (2013.01); *H01L 2224/0401* (2013.01); *H01L 2224/04042* (2013.01); *H01L 2224/08265* (2013.01); *H01L 2224/16227* (2013.01); *H01L 2224/45015* (2013.01); *H01L 2224/45147* (2013.01); *H01L 2224/4813* (2013.01); *H01L 2224/73257* (2013.01); *H01L 2924/00014* (2013.01); *H01L 2924/15311* (2013.01); *H01L 2924/16235* (2013.01); *H01L 2924/19042* (2013.01); *H01L 2924/19104* (2013.01); *H04B 5/0037* (2013.01)

(58) Field of Classification Search
CPC ...... H01F 41/066; H01F 41/069; H01F 41/07; H01F 41/071; H01F 27/2823; H01F 27/2833; H01F 27/2838; H01F 27/2842; H01L 23/5227; H01L 23/645; H01L 28/10; H01L 2924/19042; H01L 24/49
See application file for complete search history.

(56) References Cited

U.S. PATENT DOCUMENTS

| 9,400,197 | B2 | 7/2016 | Najafi et al. | |
| 2003/0122219 | A1 | 7/2003 | Park | |
| 2005/0285262 | A1 | 12/2005 | Knapp et al. | |
| 2007/0171079 | A1 | 7/2007 | Saito et al. | |
| 2007/0296056 | A1 | 12/2007 | Coyle et al. | |
| 2008/0029907 | A1* | 2/2008 | Koduri | H01F 17/045 257/784 |
| 2008/0265367 | A1* | 10/2008 | Tan | H01L 24/81 257/531 |
| 2009/0072875 | A1* | 3/2009 | Tarng | H03B 5/04 327/291 |
| 2012/0073372 | A1* | 3/2012 | Theuss | G01P 15/08 73/514.35 |
| 2013/0063236 | A1 | 3/2013 | Shin et al. | |
| 2015/0138743 | A1* | 5/2015 | Roy | H05K 1/165 361/777 |

OTHER PUBLICATIONS

Partial International Search Report—PCT/US2016/060932—ISA/EPO—dated Feb. 15, 2017.

* cited by examiner

SOLENOID INDUCTOR

CROSS-REFERENCE TO RELATED APPLICATIONS

The present application for patent claims the benefit of Provisional Patent Application No. 62/252,567 entitled "SOLENOID INDUCTOR WITH AIR CORE" filed Nov. 8, 2015, and assigned to the assignee hereof and hereby expressly incorporated herein by reference in its entirety.

FIELD OF DISCLOSURE

One or more aspects of the present disclosure relate generally to an inductor, and particularly to a solenoid inductor on a die.

BACKGROUND

Existing thin film processes is insufficient for generating 3D inductor for high performance. For example, a size of a conventional Near Field Communication (NFC) antenna 100 illustrated in FIG. 1, which is essentially an inductor, is 50 mm×85 mm (4,250 mm$^2$). For applications such as smart phones and other mobile devices, this represents a significant amount of surface area.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

A first aspect may be directed to a semiconductor device. The semiconductor device may comprise a substrate, a die on the substrate, and an inductor on the die. The inductor may comprise a wire with multiple non-planar loops above the die.

A second aspect may be directed toward a method of forming a semiconductor device. The method may comprise providing a substrate, providing a die on the substrate, and forming an inductor on the die. Forming the inductor may comprise looping a wire such that the inductor includes multiple non-planar loops above the die.

A third aspect may be directed toward a semiconductor device. The semiconductor device may comprise a substrate, a die on the substrate, an inductor on the die, and means for terminating the inductor also on the die. The inductor may comprise a wire with multiple non-planar loops above the die.

BRIEF DESCRIPTION OF THE DRAWINGS

The accompanying drawings are presented to aid in the description of embodiments disclosed and are provided to show illustrations of the embodiments and not limitation thereof.

DETAILED DESCRIPTION

Aspects are disclosed in the following description and related drawings directed to specific embodiments of one or more aspects of the present disclosure. Alternate embodiments may be devised without departing from the scope of the discussion. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As indicated above, there are limitations with the current state of the inductor-on-chip technology. Conventional thin film processes cannot generate 3D inductors for high performance. However, in one or more aspects, solenoid inductors on chips that alleviate some or all limitations of the conventional inductors on chip are proposed.

Figure 2:
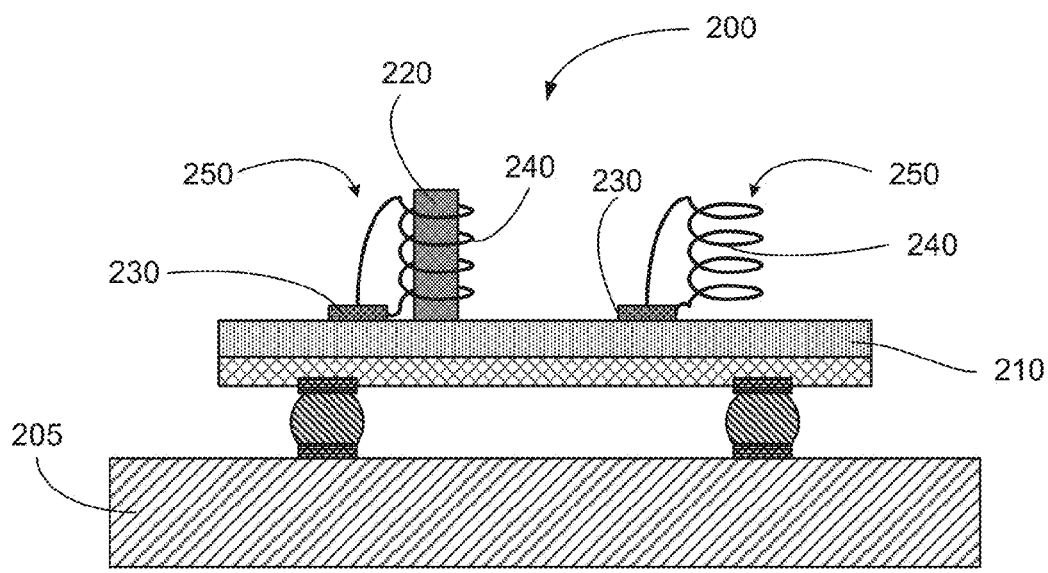
FIG. 2 illustrates example embodiments of inductors.

FIG. 2 illustrates non-limiting example embodiments of 3D inductors such as solenoid inductors. In this figure, a device 200 (e.g., semiconductor device) with two inductors on a chip or die 210 on a substrate 205 (e.g., a PCB) is shown. The inductor 250 on the left may comprise a wire 240 wound or looped around a post 220. The ends of the wire 240 terminate on bond pads 230. The bond pads 230 may be examples of means for terminating the inductors. The inductor 250 on the right may comprise a looped wire 240 that does not surround any post 220, i.e., the right inductor 250 may have an air core.

Figure 1:
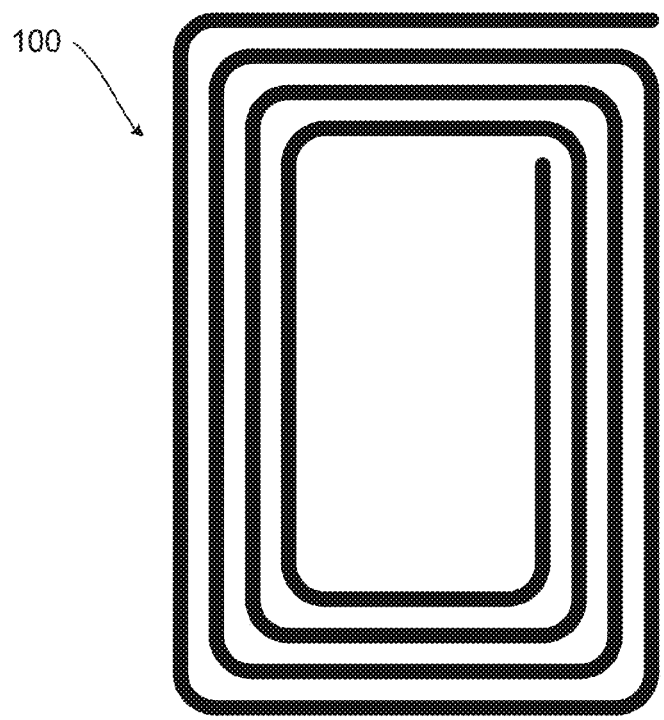
FIG. 1 illustrates a conventional Near Field Communication antenna.

For each inductor 250, it is preferred that the wire 240 be looped vertically, i.e., the inductor 250 may have multiple non-planar loops. This is unlike the surface mounted loops of conventional inductor loops such as the NFC antenna illustrated in FIG. 1. Note that the loops of the conventional antenna 100 are all on a single plane. However, each inductor 250 of FIG. 2 may comprise multiple non-planar loops including a first loop and a second loop in which the first loop is not on a same plane as the second loop. Also, the first and second loops may vertically overlap with each other at least partially. The ends of the wire 440 may terminate on bond pads 230. A non-exhaustive list of advantage include:

Reduction of losses in the magnetic field;
Very high inductor performance;
Magnetic field in the vertical direction limits coupling with other inductors on the die or on the substrate; and
Inductance can be tuned on the die.

Figure 3A:
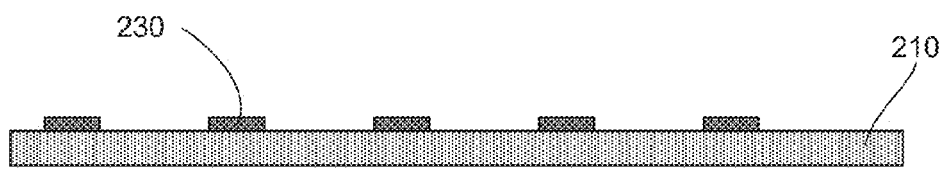
FIGS. 3A-3F illustrate stages of an example method of fabricating a device with one or more inductors on chip.

FIGS. 3A-3F illustrate side views of stages of a non-limiting example method to fabricate a semiconductor device with one or more inductors on a chip or die. Where possible, the element numberings of FIG. 2 will be carried over such that correlation between FIG. 2 and FIGS. 3A-3F are made more clear. As seen in FIG. 3A, one or more bond pads 230 may be formed on the die 210. The bond pads 230 may be assumed to be conductive and serve as terminating points of the inductors 250 (see FIG. 3C). Also, the bond pads 230 may be electrically coupled to the circuitry of the die 210 (not shown).

Figure 3B:
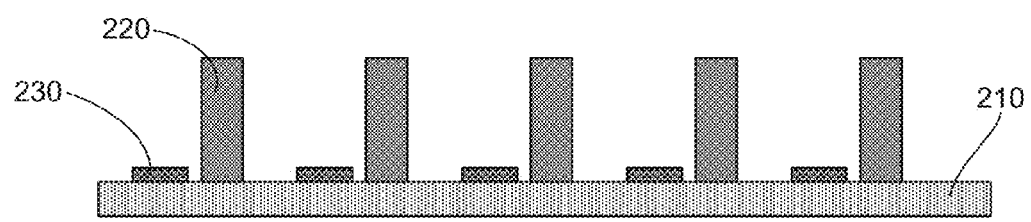
Figure 3C:
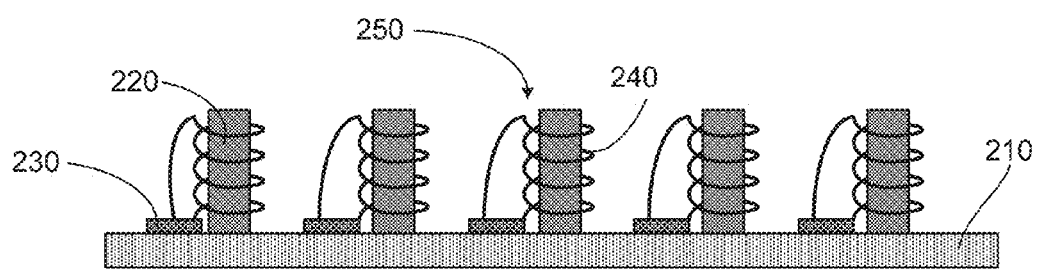

As seen in FIG. 3B, one or more posts 220 may be formed on the die 210. The posts 220 may be conductive or non-conductive. The posts 220 may also be formed from permeable materials. Then as seen in FIG. 3C, one or more inductors 250 may be formed on the die 210 by looping the wires 240 around the posts 220. Each of the inductors 250 may comprise multiple non-planar loops. The posts 220 may serve as guides to which the wires 240 may be looped or wound. It should be noted that for each inductor 250, the two ends of the corresponding wire 240 terminate at different bond pads 230. The wires 240 may be insulated or non-insulated. If the posts 220 are conductive, then insulated wires 240 are preferred. If the posts 220 are non-conductive, then non-insulated wires 240 may be used. Of course, it is also possible to wind insulated wires 240 around the non-conductive posts 220.

The inductors 250 illustrated in FIG. 3C may be satisfactory for some applications. In other words, the fabrication of the semiconductor device 200 may stop at this stage (compare with the left inductor 250 in FIG. 2). However, the fabrication may proceed to a stage illustrated in FIG. 3D. In this stage, the posts 220 may be removed so that the inductors 250 have air cores. The inductors 250 with air cores of FIG. 3D may offer improved performance over the inductors of FIG. 3C with the posts 220. Note that due to the loops, the magnetic field will be vertical (as illustrated by an arrow within the far right inductor). The vertically oriented magnetic field is also true for FIG. 3C. This will help to limit coupling among the inductors 250 on the die 210. While FIG. 3C illustrates an example in which all posts 220 are removed, this is not a requirement. That is, one or more posts 220 may remain.

Figure 3D:
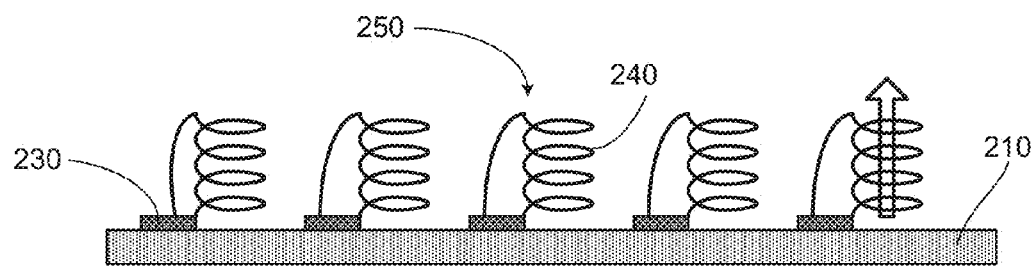
Figure 3E:
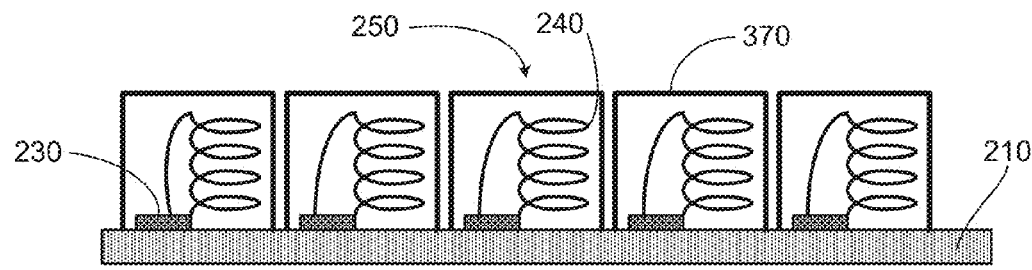
Figure 3F:
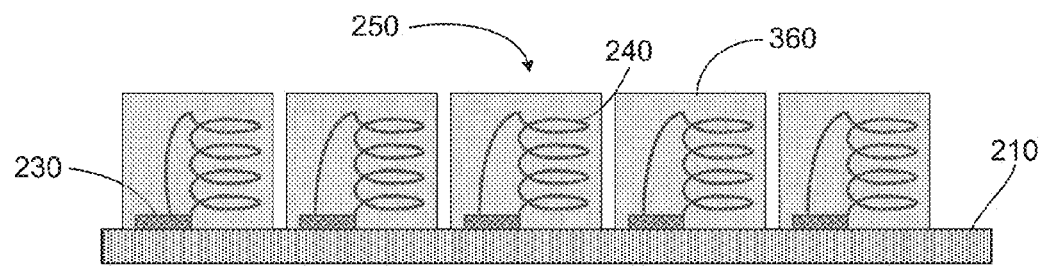

The fabrication may also stop at the stage illustrated in FIG. 3D. But as seen in FIG. 3E, the fabrication may proceed to a stage in which the inductors 250 are capped with caps 370 for additional protection. In one aspect, the cap 370 may simply surround the inductor 250 such that inside the cap 370 is unfilled other than with the inductor 250. In another aspect, instead of surrounding the inductors 250 with the caps 370, the fabrication may proceed to a stage in which the inductors 250 may be protected by being encapsulated with a mold 360 as seen in FIG. 3F.

While not shown, a variety of inductor combinations are possible. For example, when there are multiple inductors 250, there can be a combination of inductors 250 with and without the posts 220. As another example, some inductors 250 may be capped with the caps 370, some may be encapsulated with the molds 360, while yet others may have neither. Also it is emphasized that the inductors 250 are unlike the conventional inductors with surface mounted planar loops. For example, the loops of the inductors 250 may be on different planes. Also, the loops may at least partially overlap vertically. That is, one loop of the inductor 250 need not be entirely inside of another loop of the same inductor 250.

Figure 4A:
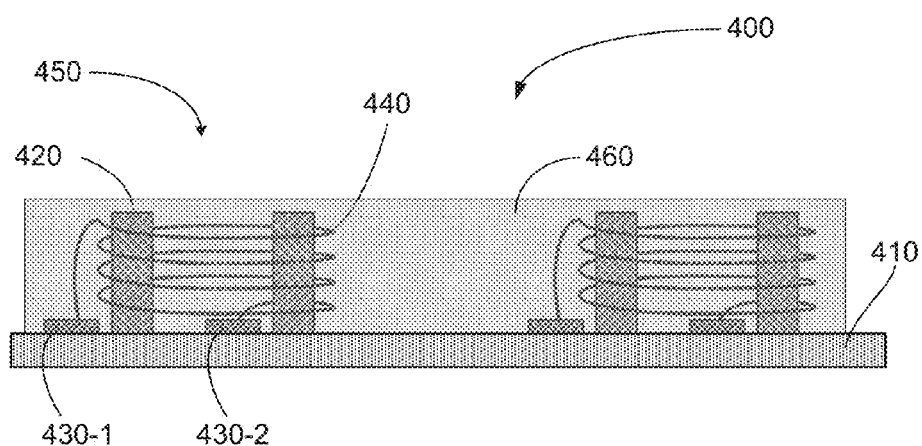
FIGS. 4A-4B illustrate example embodiments of inductors formed with a plurality of posts.
Figure 4B:
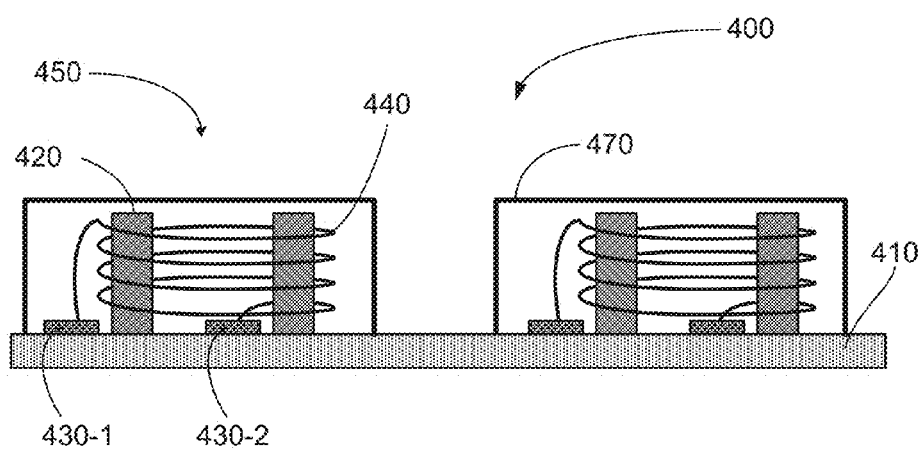

In FIGS. 2 and 3A-3F, each inductor 250 is shown as being formed by looping a wire 240 around a single post 220 multiple times. However, other inductors may be formed by looping a wire around multiple (two or more) posts. FIGS. 4A-4B illustrate non-limiting example embodiments of 3D inductors where an inductor may be formed using multiple posts. In FIG. 4A, the semiconductor device 400 may comprise a die 410 on a substrate (substrate not shown), a plurality of posts 420 on the die 410, and one or more inductors 450 formed on the die 410. At least one inductor 450 may comprise a wire 440 looped around the plurality of posts 420.

In this particular instance, the inductor 450 on the left will be described. As seen, the inductor 450 may comprise the wire 440 looped around two posts 420. As seen, the wire 440 may be looped multiple times around the posts 420. Also, the multiple loops of the inductor 450 may be non-planar. The two ends of the inductor 450, i.e., the two ends of the corresponding wire 440, may terminate at two bond pads 430—first and second bond pads 430-1, 430-2. The inductor 450 may be encapsulated with a mold 460.

FIG. 4B illustrates another embodiment of a device 400 with inductors 450 formed using a plurality of posts 420. The device of FIG. 4B is similar to the device of FIG. 4A. But instead of the mold 460, the inductors 450 of the device 400 may be capped with caps 470. In an aspect, other than the inductor 450, the insides of the caps 470 may be unfilled.

While not shown, it is also contemplated that in some embodiments, the inductors 450 need not be provided with either the cap 470 or the mold 460. Also for FIGS. 4A and/or 4B, the posts 420 may be removed in some embodiments such that the core of the inductor 450 is air.

Figure 5A:
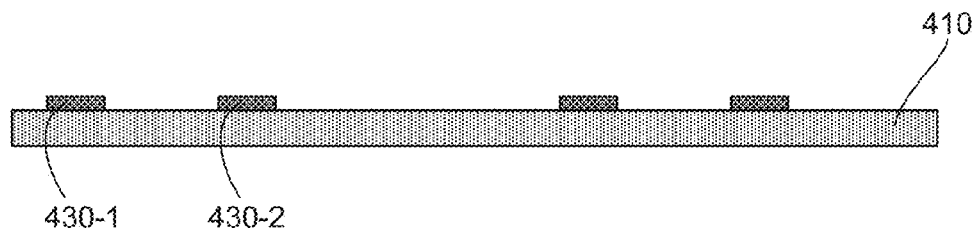
FIGS. 5A-5E illustrate stages of an example method of fabricating a device with inductors formed on a die using a plurality of posts.

FIGS. 5A-5E illustrate stages of a non-limiting example method of fabricating a device with inductors formed on a die using multiple posts. Where possible, the element numberings of FIGS. 4A and 4B will be carried over. As seen in FIG. 5A, a plurality of bond pads 430 may be formed on a die 410. The bond pads 430 may be assumed to be conductive and serve as terminating points of inductors 450. Also, the bond pads 430 may be electrically coupled to the circuitry of the die 410 (not shown).

Figure 5B:
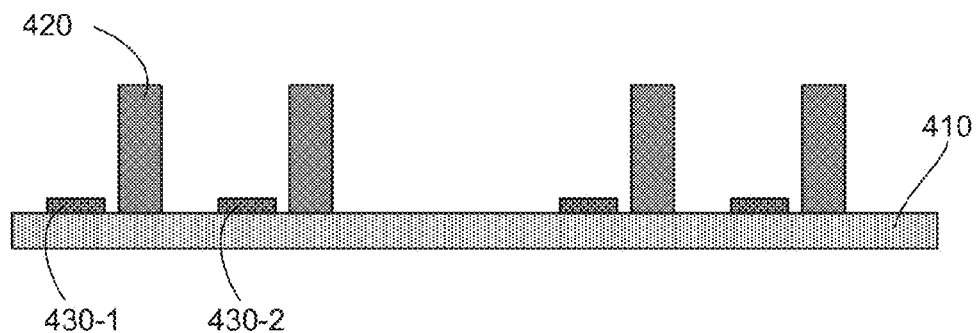
Figure 5C:
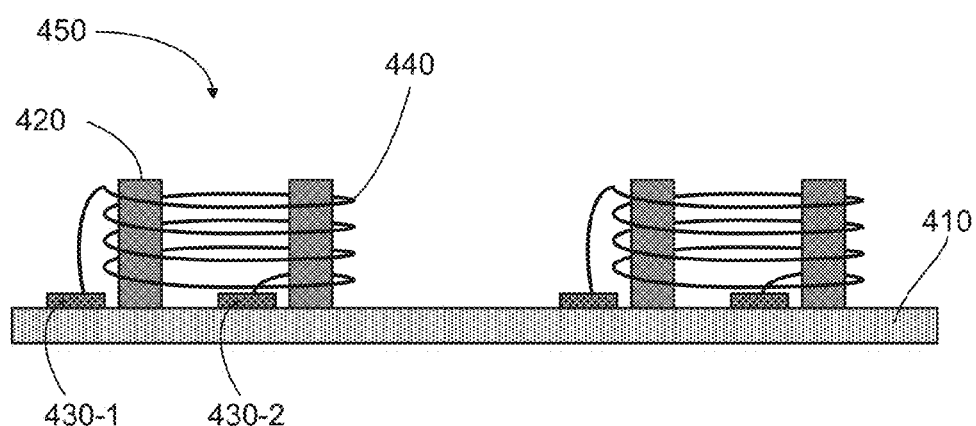

As seen in FIG. 5B, a plurality of posts 420 may be formed on the die 410. Then as seen in FIG. 5C, an inductor 450 may be formed on the die 410 by looping a wire 440 around the plurality of posts 420. Again, the inductor 450 may comprise multiple loops. Also preferably, the loops may be vertically oriented or non-planar. That is, at least first and second loops of the inductor 450 may be on different planes. The first and second loops may also intersect vertically at least partially. The plurality of posts 420 may be conductive or non-conductive. The two ends of the wire 440 corresponding to the inductor 450 may terminate at the first and second bond pads 430-1, 430-2. The wire 440 may be insulated or non-insulated. If the posts 420 are conductive, the wire 440 may be insulated. If the posts 420 are non-conductive, the wire 440 can be insulated or non-insulated.

For some application, the inductors 450 illustrated in FIG. 5C may be satisfactory, and thus, the fabrication of the semiconductor device 400 may stop at this stage. However, for other applications, the fabrication may proceed to the stage illustrated in FIG. 5D in which the inductor 450 is encapsulated with a mold 460 (with or without the posts 420). See also FIG. 4A. Alternatively, the fabrication may proceed to the stage illustrated in FIG. 5E in which the inductor 450 is capped with a cap 470 instead of being encapsulated. See also FIG. 4B. Again, inside of the cap 470 may be unfilled except the inductor 450 (with or without the posts 420).

A variety of inductor combinations are possible. For example, in one aspect as mentioned above, the process may stop after the stage illustrated in FIG. 5C. In another aspect, the process may proceed to removing the posts 420 (not shown) after the stage illustrated in FIG. 5C and the fabrication process may then stop. Alternatively, regardless of whether the posts 420 are removed or not, the fabrication process may then proceed to providing the cap 470 or the mold 460 (not shown).

FIGS. 4A-4B and 5A-5E illustrate side views of devices 400 with implementations of inductors 450 formed using multiple posts 420. FIGS. 6A-6D illustrate top views of example of some specific implementations of different types of inductors that may be formed utilizing multiple posts 420. Where possible, the element numberings of FIGS. 4A, 4B and 5A-5D will be carried over. Also, in FIGS. 6A-6D, the mold 460 and the cap 470 will not be shown so as to minimize clutter. But it should be realized that the packaged devices of some embodiments may include the mold 460 and/or the cap 470. FIGS. 6A-6D can be viewed as illustrating top views of some particular implementations of the semiconductor devices 400 corresponding to the side view of FIG. 5C in which an inductor 450 may be formed by looping a wire 440 around a plurality of posts 420.

Figure 6A:
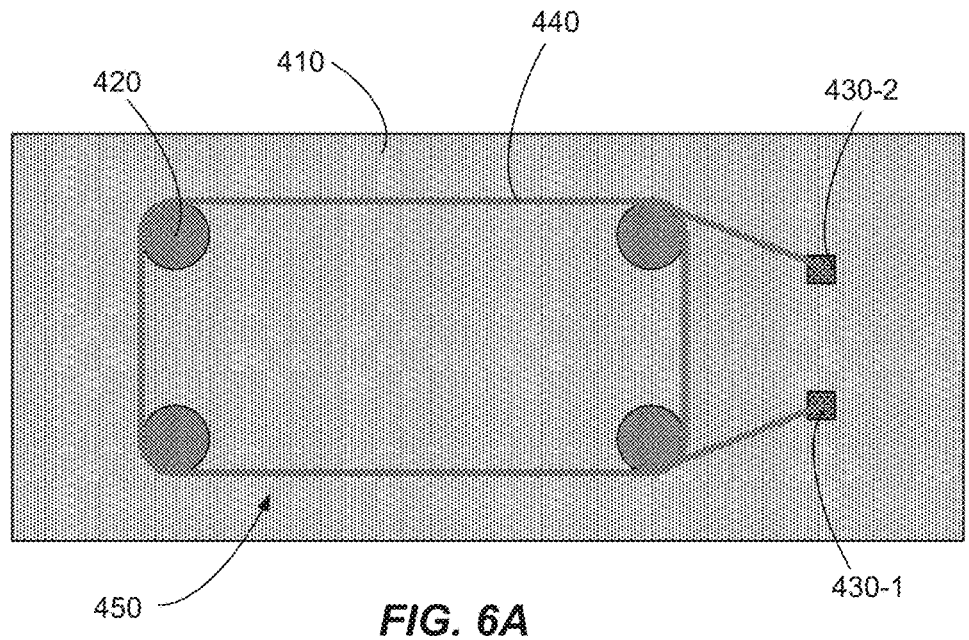
FIGS. 6A-AD illustrate more example embodiments of inductors formed with a plurality of posts.

FIG. 6A illustrates a semiconductor device 400 with an inductor 450 that may be used as a Near Field Communication (NFC) antenna and/or used in applications such as wireless charging. In this figure, four posts 420 are shown and the wire 440 may be looped multiple times around the four posts 420. Note that the wire 440 may be non-planarly looped around any number of posts 420 (e.g., three or more) for such applications. The first and second ends of the wire 440 may terminate at the first and second bond pads 430-1, 430-2.

In this particular example, none of the loops of the inductor 450 completely wraps around any individual post 420. However, this is not a requirement. In an aspect, the inductor 450 may include at least one loop that does not completely wrap around any of the individual posts 420 of the plurality of posts 420 (not shown).

For NFC applications (e.g., operations at 13.56 MHz), the configuration of FIG. 6A can provide the necessary inductance L (e.g., between 1 µH and 3.6 µH) while requiring smaller area than conventional NFC antennas. For example, an inductance of a rectangular loop $L_{rect}$ may be approximated by equation (1) below. Then by providing an inductor 450 with the following characteristics (loops=6.5, area=11 mm×11 mm, wire=10 µm Cu), an inductance L~2 µH can be achieved. In other words, sufficient inductance can be achieved while occupying significantly smaller area (11 mm×11 mm) than the conventional NFC antenna (50 mm×85 mm, see FIG. 1).

$$L_{rect} \approx N^2 \frac{\mu_0 \mu_r}{\pi} \begin{bmatrix} -2(w+h) + 2\sqrt{h^2 + W^2} \\ -h\ln\left(\frac{h + \sqrt{h^2 + W^2}}{W}\right) - W\ln\left(\frac{W + \sqrt{h^2 + W^2}}{h}\right) \\ +h\ln\left(\frac{2h}{s}\right) + W\ln\left(\frac{2W}{s}\right) \end{bmatrix} \quad (1)$$

Figure 6B:
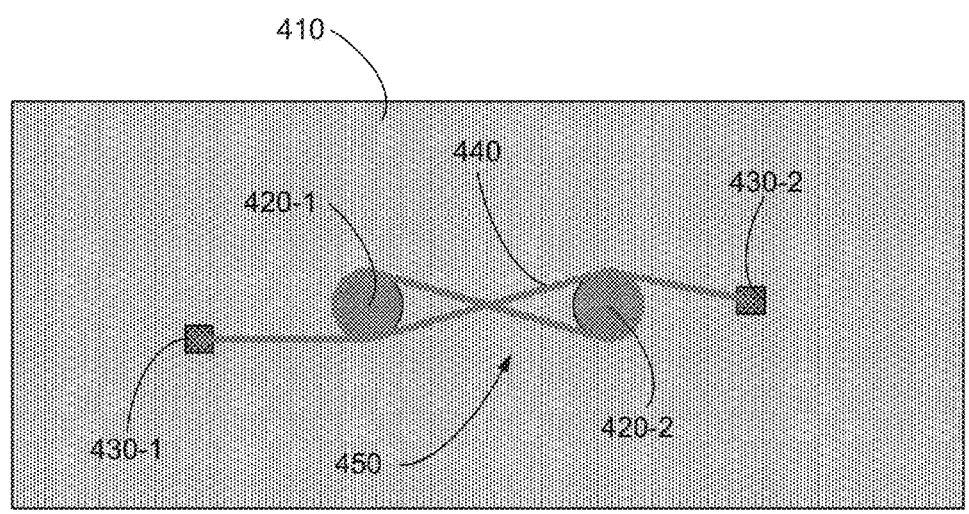
Figure 8:
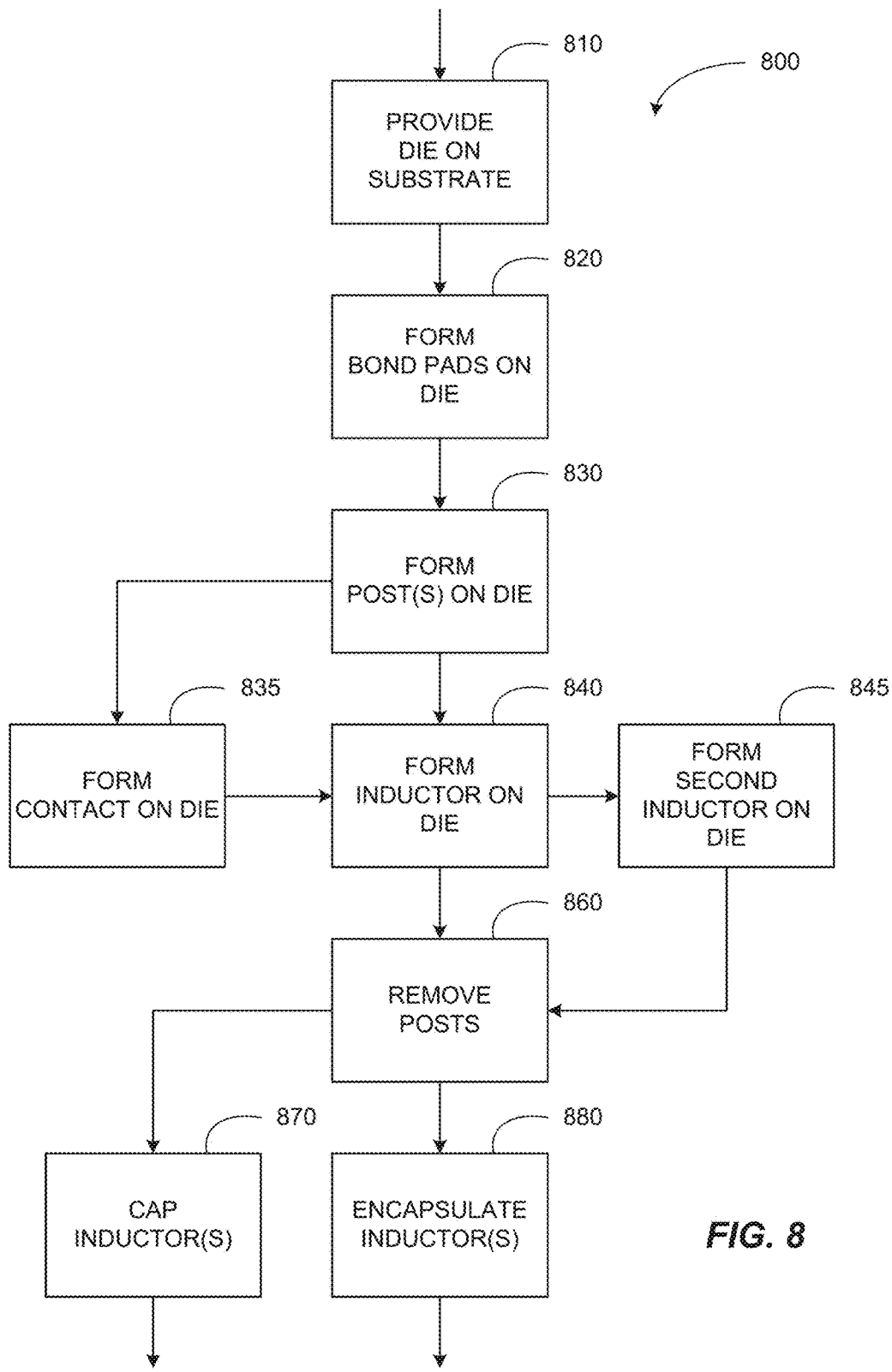
FIG. 8 illustrates a flow chart of an example method of fabricating a device.

FIG. 6B illustrates a semiconductor device 400 with an inductor 450 formed by looping a wire 440 in a figure 8 formation. As seen, two posts 420 are shown which may also be referred to as the first and second posts 420-1, 420-2. The first and second ends of the wire 440 may terminate at the first and second bond pads 430-1, 430-2. The wire 440 may be looped multiple times around the first and second posts 420-1, 420-2 such that the loops are non-planar. With such a configuration, an upward oriented magnetic field and a downward oriented magnetic field may be generated. For example, a magnetic field loop may be realized.

While not shown, more than two posts 420 may be utilized. For example, one or more posts 420 may be provided in addition to the first and second posts 420-1, 420-2 such that multiple figure 8 formations can be formed using the single wire 440. Again, the inductor 450 may include at least one loop that does not completely wrap around any individual post 420.

Figure 6C:
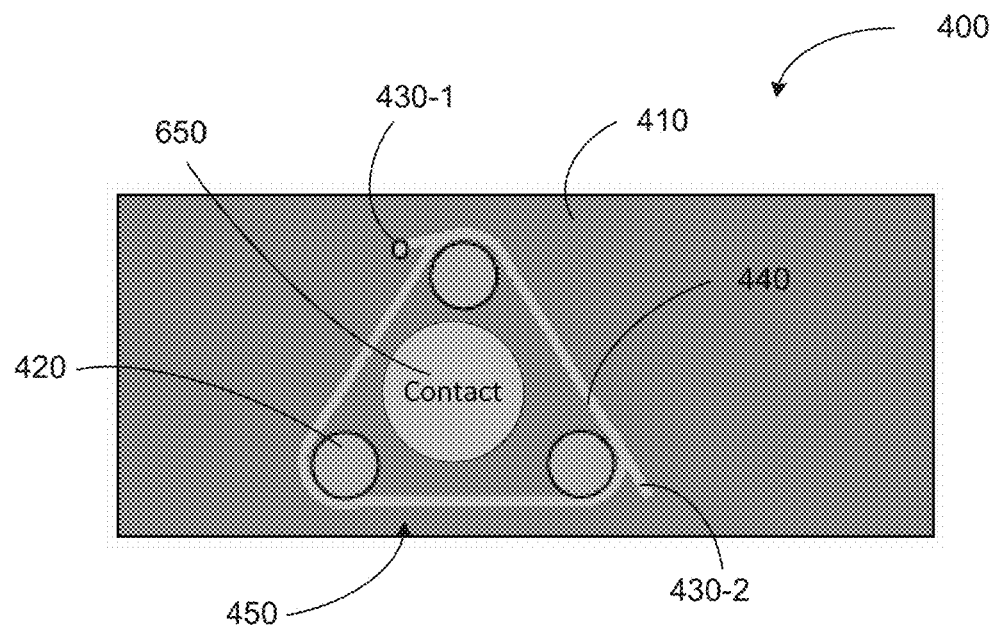

FIG. 6C illustrates a semiconductor device 400 with an inductor 450 that can be used to detect power. The inductor 450 of FIG. 6C may be looped around an input/output connection 650. An example may be a contact. For example, the contact 650 may be configured to electrically couple to any one of an input pin, an output pin, a power pin, or a ground pin of the die 410. The contact 650 may be formed on a surface of the die 410. The contact 650 may be a solder ball in one or more embodiments.

With the inductor 450 of FIG. 6C, it is possible to detect the electrical switching that takes place at the contact 650 (e.g., when power is turned on/off, when logic switches from low to high and vice versa). The inductor 450 may be formed by looping the wire 440 multiple times around the plurality of posts 420 so as to surround the contact 650. The ends of the wire 440 may terminate at bond pads 430-1, 430-2. While only three posts 420 are shown, the number of posts 420 can be greater. Note that the shape of the inductor loop can better conform to the shape of the contact 650 as the number of posts 420 grow. At least one loop may be such that it does not completely wrap around any individual post 420.

Figure 6D:
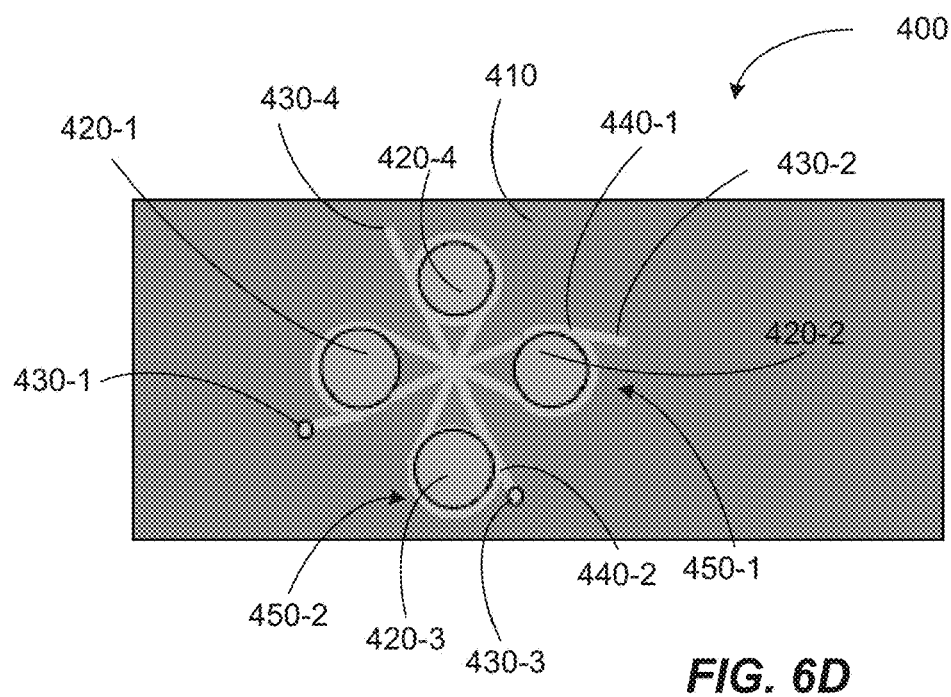

FIG. 6D illustrates a semiconductor device with two inductors 450-1, 450-2 that are nearby each other. In this figure, the plurality of posts 420 may be viewed as comprising a first plurality of posts 420-1, 420-2 and a second plurality of posts 420-3, 420-4. The first inductor 450-1 may be formed by looping a first wire 440-1 multiple times around the first plurality of posts 420-1, 420-2, e.g., so as to form non-planar loops. The ends of the first wire 440-1 may terminate at bond pads 430-1, 430-2. Also, the second inductor 450-2 may be formed by looping a second wire 440-2 multiple times around the second plurality of posts 420-3, 420-4, e.g., so as to form non-planar loops. The ends of the second wire 440-2 may terminate at bond pads 430-3, 430-4.

In FIG. 6D, the two nearby inductors 450-1, 450-2 are shown as vertically intersecting. With this configuration, the magnetic fields can be isolated or canceled as desired. However, it is not a requirement that the inductors 450-1, 450-2 vertically intersect. For example, while not shown, one inductor (e.g., first inductor 450-1) may be placed inside another inductor (e.g., second inductor 450-2). The two inductors 450-1, 450-2 can be placed sufficiently near each other so that some coupling can take place (e.g., for magnetic field isolation and/or cancellation). Note that the amount of coupling can be controlled. Also, one or both of the first and/or second plurality of posts 420 can comprise more than two posts 420 (not shown). In addition, there can be more than two inductors 450 placed nearby one other (not shown).

Figure 7A:
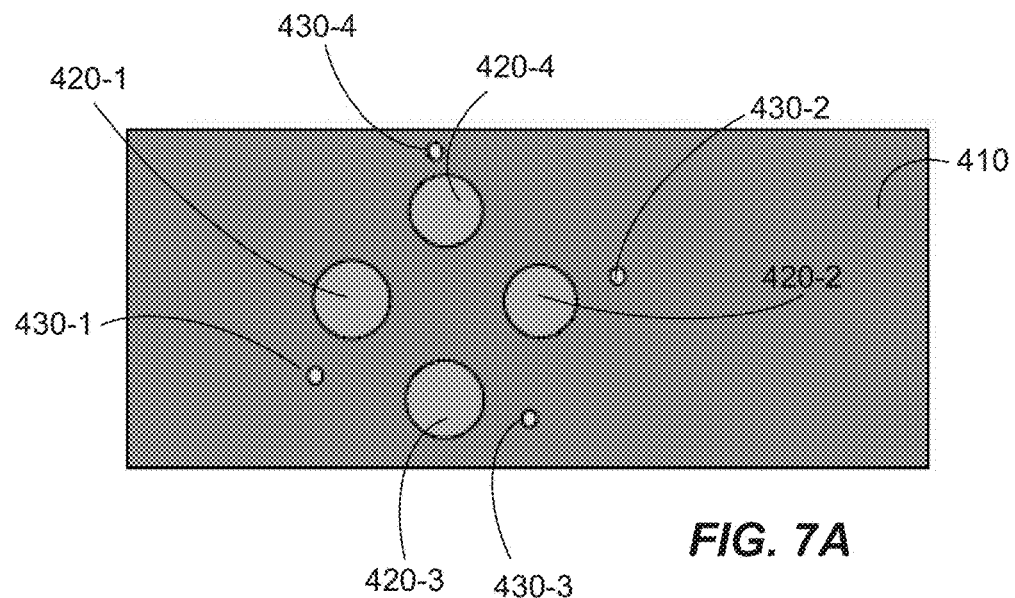
FIGS. 7A-7F illustrate stages of an example process to fabricate the semiconductor device with intersecting inductors.
Figure 7B:
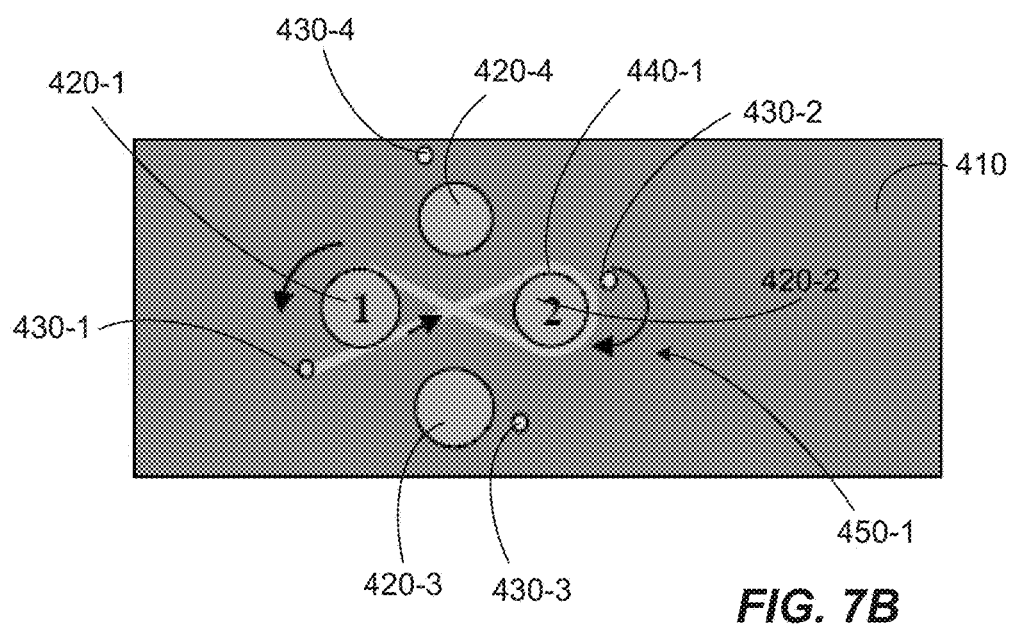
Figure 7C:
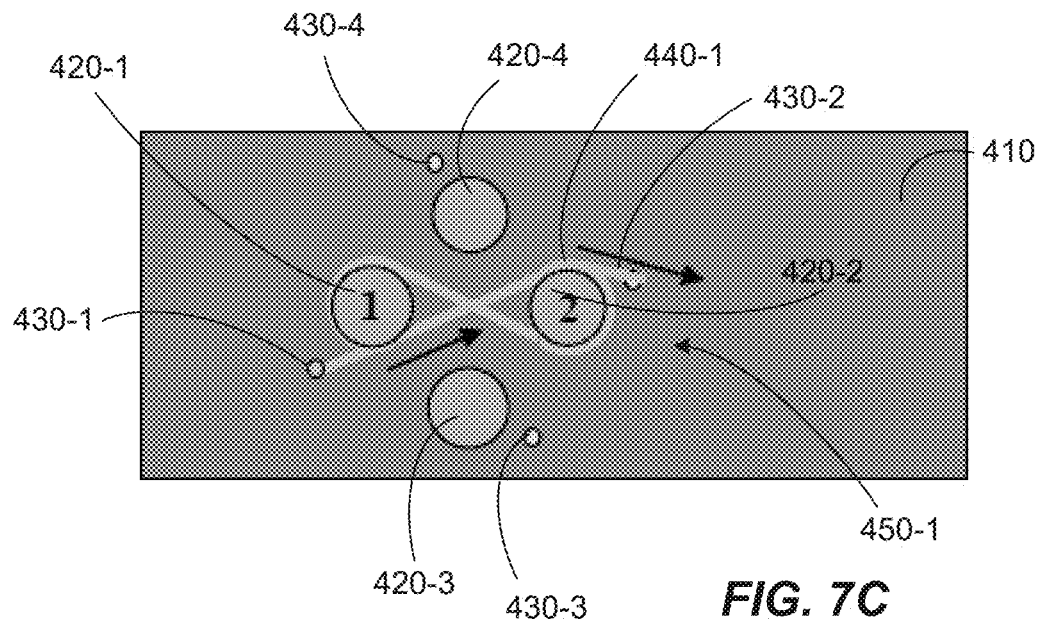

FIGS. 7A-7F illustrate some stages of a non-limiting example process to fabricate the semiconductor device 400 illustrated in FIG. 6D. FIG. 7A illustrates the first plurality of posts 420-1, 420-2, the second plurality of posts 420-3, 420-4, and the bond pads 430-1, 430-2, 430-3, 430-4 formed on the die 410. In FIG. 7B, the first wire 440-1 is illustrated as being looped around the first plurality of posts 420-1, 420-2 to form the first inductor 450-1. The first wire 440-1 may be bonded to the bond pad 430-1 near the post 420-1 and looped outside of the post 420-2. As seen FIG. 7C, the first wire 440-1 may continue around the post 420-1 and above the portion of the first wire 440-1 previously shown in FIG. 7B in a figure 8 formation. The first wire 440-1 may be looped multiple times in this figure 8 formation (see also inductor 450 of FIG. 6B) to where it is bonded to the bond pad 430-2 to complete the first inductor 450-1.

Figure 7D:
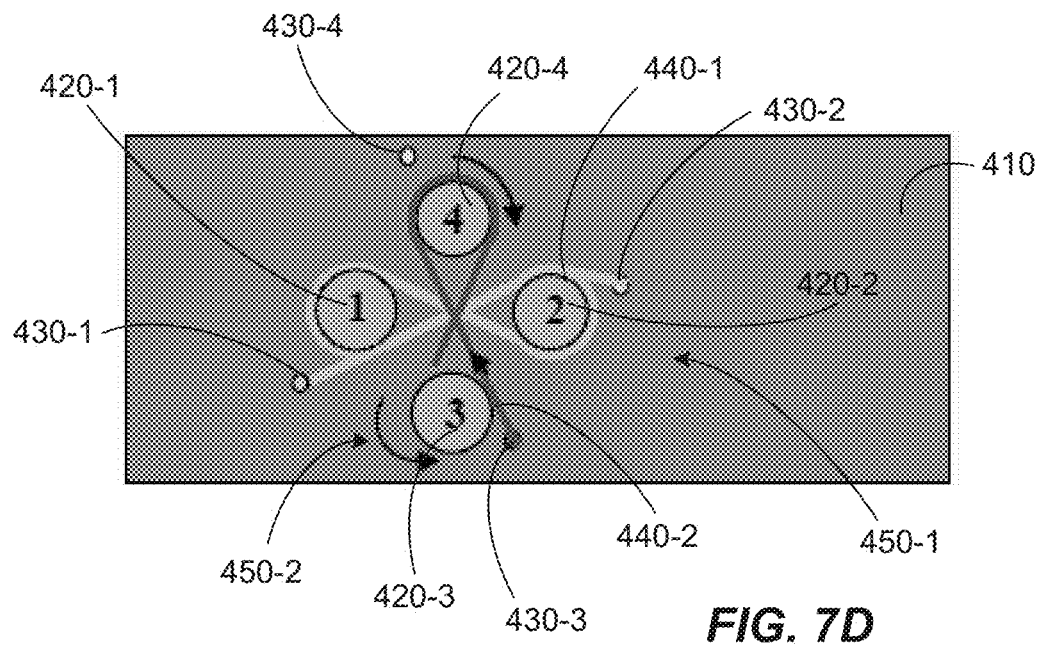

In a similar way, the second inductor 450-2 may be formed. As seen in FIG. 7D, the second wire 440-2 may be bonded to the bond pad 430-3 near the post 420-3 and looped around outside of the post 420-4. As seen FIG. 7E, the second wire 440-2 may continue around the post 420-3 and above the portion of the second wire 440-1 previously shown in FIG. 7D again in a figure 8 formation. The second wire 440-2 may be looped multiple times in this figure 8 formation to where it is bonded to the bond pad 430-4 to complete the second inductor 450-2. The second wire 440-2 may be above the first wire 440-1.

Figure 7E:
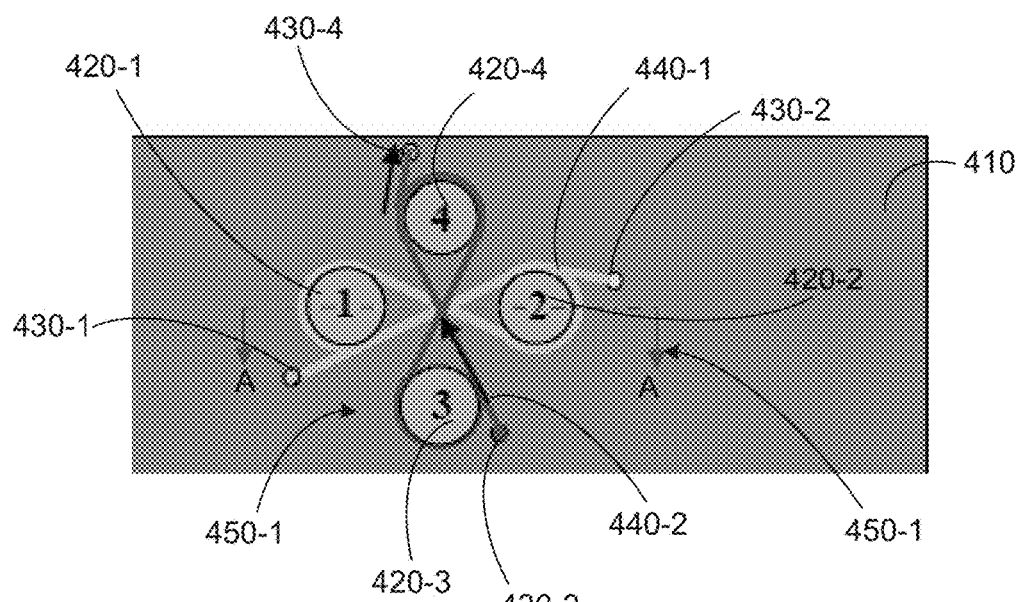
Figure 7F:
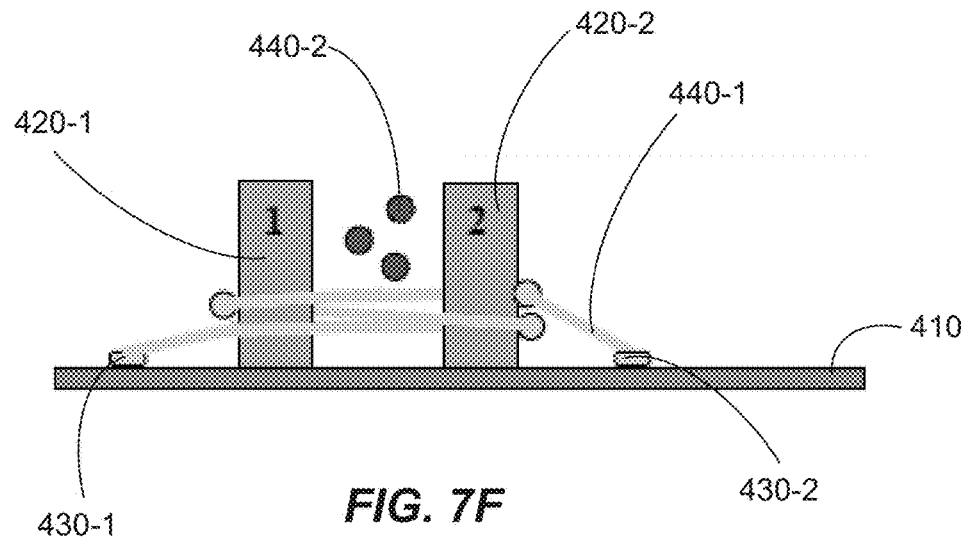

FIG. 7F illustrates a side view of a cross section of the semiconductor device along the line A-A of FIG. 7E. Note that the loops of the second wire 440-2 (illustrated as dots) are above the loops of the first wire 440-1. In this side view, the first wire 440-1 (corresponding to the first inductor 450-1) is shown as having multiple non-planar loops. Similarly, the second wire 440-2 (corresponding to the second inductor 450-2) is shown as having multiple non-planar loops.

Regarding the inductors 450 formed by utilizing multiple posts 420, the wire 440 need not completely wrap around any individual post 420. Also, the loops may be consistent. That is, the loops of the inductor 450 may vertically overlap with each other. In this way, the magnetic field can be made more uniform within the core of the inductor 450. In one or more aspects, when an inductor 450 is formed using a plurality of posts 420, it can be said that for at least one loop of the inductor 450, the wire 440 corresponding to the inductor 450 need not completely wrap around any individual post 420. It can also be said that at least one loop of the inductor 450 may vertically overlaps with at least one other loop of the inductor 450.

FIG. 8 illustrates a flow chart of a non-limiting example method of fabricating a device such as the devices 200, 400. It should be noted that not all illustrated blocks of FIG. 8 need to be performed, i.e., some blocks may be optional. Also, the numerical references to the blocks of the FIG. 8 should not be taken as requiring that the blocks should be performed in a certain order.

In block 810, a die 210, 410 may be provided on a substrate 205 such as a PCB. In block 820, one or more bond pads 230, 430 may be formed on the die 210, 410. FIGS. 3A and 5A may correspond to the block 820. In block 830, one or more posts 220, 420 may be formed on the die 210, 410. FIGS. 3B and 5B may correspond to the block 830.

In block 840, one or more inductors 250, 450 may be formed. FIGS. 3C and 5C may correspond to the block 840. An inductor 250, 450 may be formed by looping a wire 240, 440 such that the inductor 250, 450 includes multiple non-planar loops above the die 210, 410. The inductor 250 may be formed by looping the wire 240 around a single post 220 as seen in FIG. 3C.

The inductor 450 may be formed by looping the wire 440 around multiple posts 420 as seen in FIG. 5C. Specific example implementations are illustrated in FIGS. 6A (e.g., NFC antenna), 6B (e.g., figure 8 loops) and 6C (e.g., power detection). In an aspect, at least one loop of the inductor 450 need not completely wrap around any individual post 420. The fabrication method 800 may stop after the block 840.

The method 800 may also continue in block 860 in which the posts 220, 420 may be removed. FIG. 3D may correspond to block 830. This block is optional in that the posts 220, 420 need not be removed. If the posts 220, 420 are removed, then the inductor 250, 450 may have an air core. The fabrication method 800 may stop after the block 860.

Figure 5D:
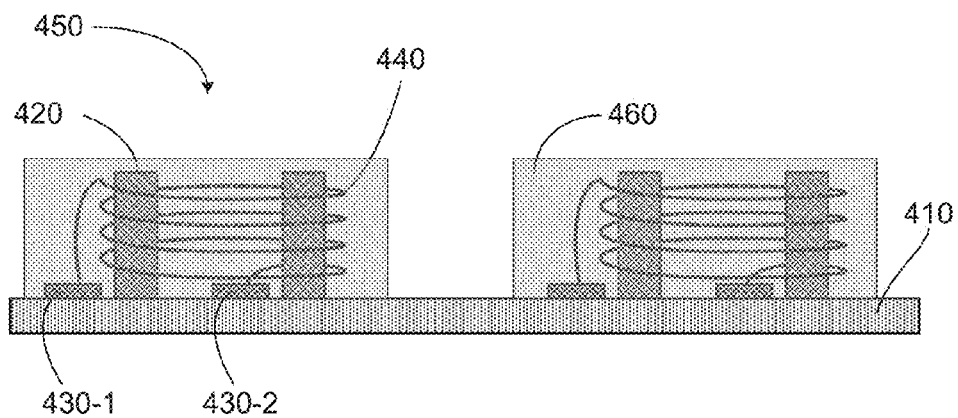
Figure 5E:
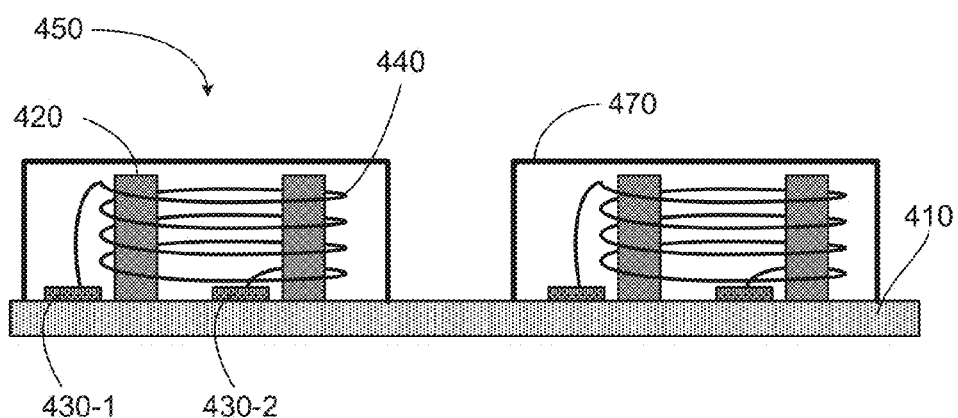

In block 870, the inductor 250, 450 may be surrounded with a cap 370, 470. FIGS. 3E and 5E may correspond to block 870. Alternatively, in block 880, the inductor 250, 450 may be encapsulated with a mold 360, 460. FIGS. 3F and 5D may correspond to block 880.

If a power detection inductor is desired (see FIG. 6C), the method 800 in block 835 may form a contact 650 on the die 410, and the inductor 450 may be formed in block 840 to surround the contact 650. The contact 650 may be coupled to any one of one of an input pin, an output pin, a power pin, and a ground pin of the die 410.

If multiple inductors are desired (see FIGS. 6D, 7A-7F), then in addition to forming the first inductor 450-1 in block 840, the method 800 in block 845 may form the second inductor 450-2 in block 845. For example, the second inductor 450-2 may be formed by looping a second wire 440 around the second plurality of posts 420-3, 420-4. The second inductor 450-2 may include multiple non-planar loops above the die 410. The second inductor 450-2 may also vertically intersect with the first inductor 450-1.

Figure 9:
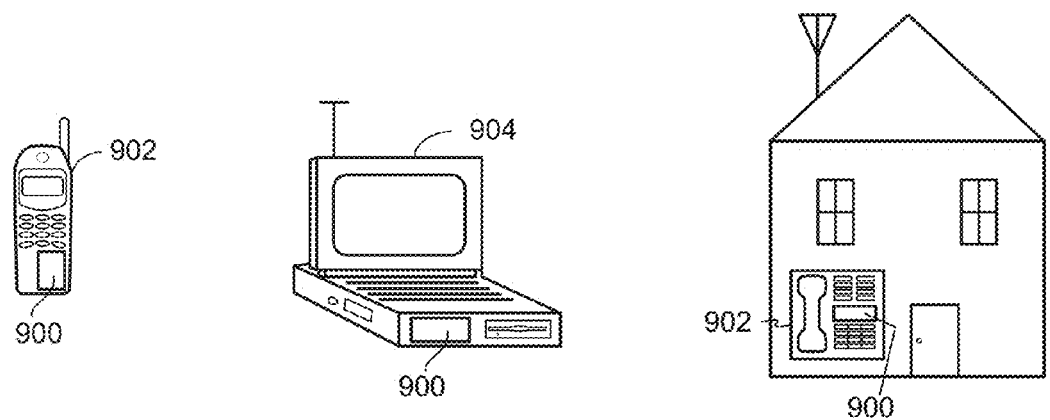
FIG. 9 illustrates examples of devices with a device with inductor(s) integrated therein.

FIG. 9 illustrates various electronic devices that may be integrated with any of the aforementioned devices 200, 400 that includes inductors 250, 450. For example, a mobile phone device 902, a laptop computer device 904, and a fixed location terminal device 906 may include a device package 900 as described herein. The device package 900 may be, for example, any of the integrated circuits, dies, integrated devices, integrated circuit devices, device packages, semiconductor devices, package-on-package devices, and so on. The devices 902, 904, 906 illustrated in FIG. 9 are merely exemplary. Other electronic devices may also feature the device 200, 400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the implementations disclosed herein may be implemented as electronic hardware, computer software, or combinations of both. To clearly illustrate this interchangeability of hardware and software, various illustrative components, blocks, modules, circuits, and processes have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present technology described herein.

The methods, sequences, and/or algorithms described in connection with the implementations disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an implementation of the technology described herein can include a computer-readable media embodying a method of manufacturing a semiconductor device. Accordingly, the technology described herein is not limited to illustrated examples, and any means for performing the functionality described herein are included in implementations of the technology described herein.

While the foregoing disclosure shows illustrative implementations of the technology described herein, it should be noted that various changes and modifications could be made herein without departing from the scope of the technology described herein as defined by the appended claims. The functions and/or actions of the method claims in accordance with the implementations of the technology described herein described herein need not be performed in any particular order. Furthermore, although elements of the technology described herein may be described or claimed in the singular, the plural is contemplated unless limitation to the singular is explicitly stated.

What is claimed is:

1. A semiconductor device, comprising:
   a substrate;
   a die on the substrate;
   a plurality of posts over and on the die; and
   an inductor on the die,
   wherein the inductor comprises a wire with multiple non-planar loops above the die such that at least one loop of the inductor vertically overlaps with at least one other loop of the inductor, and
   wherein the wire of the inductor is looped around the plurality of posts.

2. The semiconductor device of claim 1, wherein the inductor does not completely wrap around any individual post of the plurality of posts.

3. The semiconductor device of claim 1, wherein at least one loop of the inductor does not completely wrap around any individual post of the plurality of posts.

4. The semiconductor device of claim 1,
   wherein the plurality of posts comprise first and second posts, and
   wherein the wire is looped around the first and second posts in a FIG. 8 formation.

5. The semiconductor device of claim 1,
   wherein the plurality of posts comprise a first plurality of posts, the wire is a first wire, and the inductor is a first inductor,
   wherein the plurality of posts also comprise a second plurality of posts, and
   wherein the semiconductor device further comprises a second inductor on the die, the second inductor comprising a second wire looped around the second plurality of posts, and the second inductor having multiple non-planar loops above the die.

6. The semiconductor device of claim 5, wherein the first inductor vertically intersects with the second inductor.

7. The semiconductor device of claim 5, wherein the first inductor is inside the second inductor.

8. The semiconductor device of claim 1, further comprising a contact on the die,
   wherein the contact configured to be electrically coupled to one of an input pin, an output pin, a power pin, and a ground pin of the die, and
   wherein the inductor surrounds the contact.

9. The semiconductor device of claim 1, further comprising first and second bond pads on the die,
   wherein first and second ends of the wire terminate at the first and second bond pads, respectively.

10. The semiconductor device of claim 1,
    wherein the plurality of posts are conductive posts and the wire is an insulated wire, or
    wherein the plurality of posts are non-conductive posts and the wire is a non-insulated wire.

11. The semiconductor device of claim 9, further comprising a cap on the die, the cap surrounding the wire of the inductor, the plurality of posts looped by the wire, and the first and second bond pads.

12. The semiconductor device of claim 11, wherein an inside of the cap is unfilled other than the wire of the inductor, the plurality of posts looped by the wire, and the first and second bond pads.

13. The semiconductor device of claim 9, further comprising a mold on the die, the mold encapsulating the wire of the inductor, the plurality of posts looped by the wire, and the first and second bond pads.

14. A semiconductor device, comprising:
a substrate;
a die on the substrate;
a plurality of posts over and on the die;
an inductor on the die; and
means for terminating the inductor on the die,
wherein the inductor comprises a wire with multiple non-planar loops above the die such that at least one loop of the inductor vertically overlaps with at least one other loop of the inductor, and
wherein the wire of the inductor is looped around the plurality of posts.

15. The semiconductor device of claim 14,
wherein at least one loop of the inductor does not completely wrap around any individual post of the plurality of posts.

16. The semiconductor device of claim 14,
wherein the plurality of posts comprise a first plurality of posts, the wire is a first wire, and the inductor is a first inductor,
wherein the plurality of posts also comprise a second plurality of posts, and
wherein the semiconductor device further comprises a second inductor on the die, the second inductor comprising a second wire looped around the second plurality of posts, and the second inductor having multiple non-planar loops above the die.

17. The semiconductor device of claim 16, wherein the first inductor vertically intersects with the second inductor.

18. The semiconductor device of claim 16, wherein the first inductor is inside the second inductor.

19. The semiconductor device of claim 14, wherein the inductor does not completely wrap around any individual post of the plurality of posts.

20. The semiconductor device of claim 14,
wherein the plurality of posts comprise first and second posts, and
wherein the wire is looped around the first and second posts in a FIG. 8 formation.

21. The semiconductor device of claim 14, further comprising a contact on the die,
wherein the contact is configured to be electrically coupled to one of an input pin, an output pin, a power pin, and a ground pin of the die, and
wherein the inductor surrounds the contact.

22. The semiconductor device of claim 14,
wherein the means for terminating the inductor comprises first and second bond pads on the die, and
wherein first and second ends of the wire terminate at the first and second bond pads, respectively.

23. The semiconductor device of claim 14,
wherein the plurality of posts are conductive posts and the wire is an insulated wire, or
wherein the plurality of posts are non-conductive posts and the wire is a non-insulated wire.

24. The semiconductor device of claim 14, further comprising a cap on the die, the cap surrounding the wire of the inductor, the plurality of posts looped by the wire, and the means for terminating the inductor.

25. The semiconductor device of claim 14, further comprising a mold on the die, the mold encapsulating the wire of the inductor, the plurality of posts looped by the wire, and the means for terminating the inductor.

26. The semiconductor device of claim 24, wherein an inside of the cap is unfilled other than the wire of the inductor, the plurality of posts looped by the wire, and the means for terminating the inductor.

* * * * *